United States Patent
Otsuru et al.

(10) Patent No.: US 8,692,330 B2
(45) Date of Patent: Apr. 8, 2014

(54) SEMICONDUCTOR DEVICE

(75) Inventors: Yuzo Otsuru, Ora-gun (JP); Yasuhiro Takeda, Ora-gun (JP); Shigeyuki Sugihara, Ibi-gun (JP); Shinya Inoue, Yokkaichi (JP)

(73) Assignee: Semiconductor Components Industries, LLC, Phoenix, AZ (US)

( * ) Notice: Subject to any disclaimer, the term of this patent is extended or adjusted under 35 U.S.C. 154(b) by 93 days.

(21) Appl. No.: 13/529,774

(22) Filed: Jun. 21, 2012

(65) Prior Publication Data
US 2012/0326235 A1   Dec. 27, 2012

(30) Foreign Application Priority Data
Jun. 22, 2011 (JP) ................................ 2011-138448

(51) Int. Cl.
*H01L 23/60* (2006.01)
(52) U.S. Cl.
USPC ............ 257/360; 257/355; 257/401; 257/384
(58) Field of Classification Search
USPC .................. 257/360, 355, 401, 384
See application file for complete search history.

(56) References Cited

U.S. PATENT DOCUMENTS

| 5,731,614 | A | * | 3/1998 | Ham | 257/355 |
| 5,874,763 | A | * | 2/1999 | Ham | 257/360 |
| 5,939,753 | A | * | 8/1999 | Ma et al. | 257/339 |
| 6,469,354 | B1 | * | 10/2002 | Hirata | 257/358 |
| 6,611,025 | B2 | * | 8/2003 | Lin | 257/355 |
| 6,639,283 | B1 | * | 10/2003 | Hung et al. | 257/355 |
| 6,815,775 | B2 | * | 11/2004 | Ker et al. | 257/355 |
| 6,933,569 | B2 | * | 8/2005 | Koh et al. | 257/347 |

FOREIGN PATENT DOCUMENTS

JP          6-177328          6/1994

* cited by examiner

*Primary Examiner* — Eugene Lee

(57) ABSTRACT

A semiconductor device equally turns on the parasitic bipolar transistors in the finger portions of the finger form source and drain electrodes when a surge voltage is applied, even with the P+ type contact layer surrounding the N+ type source layers and the N+ type drain layers connected to the finger form source and drain electrodes. A P+ type contact layer surrounds N+ type source layers and N+ type drain layers. Metal silicide layers are formed on the N+ type source layers, the N+ type drain layers, and a portion of the P+ type contact layer. Finger form source electrodes, finger form drain electrodes, and a P+ type contact electrode surrounding these finger form electrodes are formed, being connected to the metal silicide layers respectively through contact holes formed in an interlayer insulation film deposited on the metal silicide layers.

6 Claims, 9 Drawing Sheets

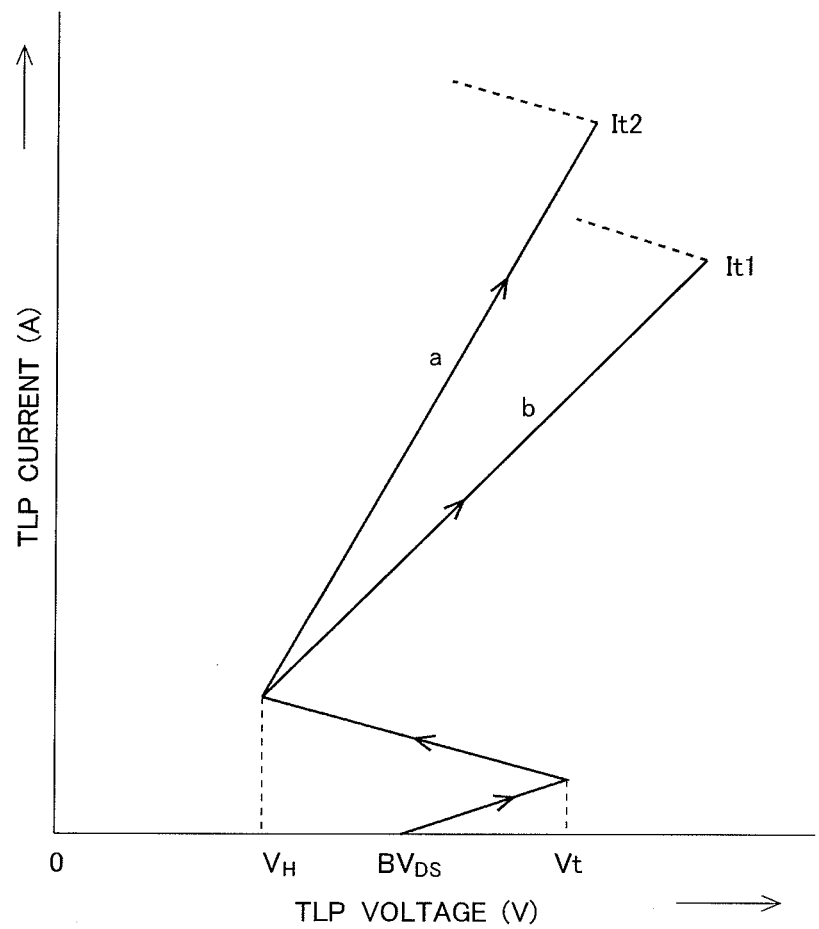

SEMICONDUCTOR DEVICE

CROSS-REFERENCE OF THE INVENTION

This application claims priority from Japanese Patent Application No. 2011-138448, the content of which is incorporated herein by reference in its entirety.

BACKGROUND OF THE INVENTION

1. Field of the Invention

The invention relates to a semiconductor device, in particular, an ESD protection element including a MOS transistor having a high ESD protection characteristic.

2. Description of the Related Art

An LDMOS transistor as well as IGBT has higher switching performance and more stable performance than a bipolar type power transistor, and thus it is widely used in an inverter circuit for a switching power supply such as a DC-DC converter, an inverter circuit for a motor or a lighting device, and so on. The LDMOS is an abbreviation of a Lateral Double Diffused Metal Oxide Semiconductor and means a lateral double-diffused gate MOS. The ESD is an abbreviation of Electro-Static Discharge and means the discharge of static electricity.

Conventionally, for addressing ESD, various types of semiconductor devices including protection circuits using semiconductor devices have been proposed. Typically, as shown in FIG. 8, an internal circuit 56 is protected by connecting a PN junction diode 52 between an input output terminal 50 and a power supply line 51, connecting a PN junction diode 54 between the input output terminal 50 and a ground line 53, and connecting a PN junction diode 55 between the power supply line 51 and the ground line 53.

However, as the miniaturization of elements is enhanced for a demand for higher speed and so on, the electrostatic breakdown tolerance of a semiconductor device is decreased and thus a more proper ESD protection element is essential. When an LDMOS transistor is used as a power transistor as an ESD protected element, a MOS transistor may be used as an ESD protection element for the reason that the snapback characteristic of its parasitic bipolar transistor which will be described below is usable or the like.

FIG. 7 shows an example of a system including a drive circuit 36 and two power NLDMOS transistors 30 and 31 as ESD protected elements connected in series, the system being disposed between a power supply 34 and a ground line. As ESD protection elements, MOS transistors 32 and 33 are connected in series in each of which the source electrode and the gate electrode are connected, being disposed between the power supply 34 and the ground line as shown in FIG. 7.

The connection node of the NLDMOS transistors 30 and 31 and the connection node of the ESD protection elements 32 and 33 are connected to each other, being led to an output terminal 35. In this system, the snapback voltages $V_{t1}$ of the MOS transistors 32 and 33 as the ESD protection elements are designed to be smaller than the snapback voltages $V_{T1}$ of the power NLDMOS transistors 30 and 31 as the ESD protected elements.

By this, when a surge voltage by large positive static electricity is applied to the drain electrode, the surge current is discharged from the MOS transistor 32 or 33 on the ESD protection element side and the power NLDMOS transistors 30 and 31 as the ESD protected elements are protected.

Although details will be described below, the snapback voltage means a trigger voltage to start discharging static electricity to a ground line or the like when a surge voltage by large static electricity is applied to an input output terminal or the like. Japanese Patent Application publication No. 6-177328 discloses the enhancement of the ESD protection characteristic by decreasing the snapback voltage when a MOS transistor is used as an ESD protection element.

Ordinarily, in a power NLDMOS transistor as an ESD protected element, the P+ type contact layer is formed in parallel with the N+ type source layer, and the potential of the P type body layer as the back gate is fixed to the potential of the N+ type source layer. As a result, even when holes generated by an avalanche breakdown near the N+ type drain layer flow into the N+ type source layer side, the holes are absorbed in the P+ type contact layer and the potential of the P type body layer is not increased largely, thereby preventing the turn-on of the parasitic bipolar transistor which uses the N+ type source layer as the emitter, the P type body layer as the base and the N+ type drain layer as the collector.

On the other hand, as described below, a MOS transistor as an ESD protection element uses the phenomenon that holes, which are generated near the N+ type drain layer by an avalanche breakdown and flow into the N+ type source layer side when a surge voltage by positive static electricity larger than the drain-source breakdown voltage $BV_{DS}$ is applied to the drain electrode, increase the potential of the P type body layer to a predetermined value or more to turn on the parasitic bipolar transistor described above.

Therefore, the P+ type contact layer need to have a structure which does not easily absorb holes accumulated in the P type body layer around the N+ type source layer, or need to be disposed away from the N+ type source layer. This structure enables the parasitic bipolar transistor of the ESD protection element to turn on and discharge static electricity to the ground line etc through the ESD protection element. As a result, the ESD protected element is protected from a surge voltage by positive static electricity.

In the ESD protection element, the P+ type contact layer functions as a discharge path of static electricity when large negative static electricity is applied to the drain electrode. Therefore, it is not necessary to dispose the P+ type contact layer in parallel with the N+ type source layer, and the P+ type contact layer is disposed so as to surround the peripheral region of the MOS transistor including the drain region disposed away from the N+ type source layer.

By disposing the P+ type contact layer so as to surround the peripheral region of the MOS transistor as the protection element, the holes described above do not easily flow into the P+ type contact layer and are accumulated in the P type body layer near the N+ type source layer, thereby increasing the potential of the P type body layer. Therefore, the parasitic bipolar transistor described above turns on and discharges a surge current by positive static electricity to the ground line etc immediately.

However, in a case of an ESD protection element using finger form electrodes in which a plurality of finger form source electrodes and a plurality of finger form drain electrodes are inserted therebetween, a parasitic bipolar transistor does not turn on in the finger portion in the peripheral region of the MOS transistor near the P+ type contact layer and the ESD protection element may not work enough.

This is because a parasitic bipolar transistor formed by an N+ type source layer, a P type body layer and an N+ type drain layer disposed nearer the P+ type contact layer in the peripheral region turns on less easily, since holes flowing into the N+ type source layer easily flow into the P+ type contact layer.

It is necessary to realize an ESD protection element in which even a parasitic bipolar transistor formed by an N+ type source layer, a P type body layer and an N+ type drain layer in the finger portion near the P+ type contact layer surrounding the peripheral region of the MOS transistor turns on enough.

SUMMARY OF THE INVENTION

The invention provides a semiconductor device that includes a semiconductor layer of a first general conductivity type, an element isolation insulation film isolating the semiconductor layer, a well layer of a second general conductivity type formed in a surface portion of the semiconductor layer, a plurality of body layers of the second general conductivity type formed in a surface portion of the well layer so as to extend parallel with each other in a first direction, a plurality of source layers of the first general conductivity type and a plurality of drain layers of the first general conductivity type which are formed in surface portions of corresponding body layers so that the source layers and the drain layers extend in the first direction and alternate in a second direction perpendicular to the first direction, and a contact layer of the second general conductivity type formed in a surface portion of the well layer and a surface portion of the body layer adjacent the element isolation insulation film. The contact layer surrounds the source layers and the drain layers. The device also includes a gate electrode formed on the body layer and the well layer and extending in the first direction between the source layers and the drain layers through a gate insulation film, and metal silicide layers formed in surface portions of the source layers, in surface portions of the drain layers, and in surface portions of a portion of the contact layer that extends in the second direction. No metal silicide layer is formed in a surface portion of a portion of the contact layer that extends in the first direction. The device further includes a finger form source electrode, a finger form drain electrode, and a contact electrode surrounding the source and drain electrodes. Each of the source, drain and contact electrodes is connected to the metal silicide layers through contact holes formed in an interlayer insulation film deposited on the metal silicide layers.

BRIEF DESCRIPTION OF THE DRAWINGS

FIG. 5 is a graph showing a relation of the TLP currents and TLP voltages of the semiconductor device of the embodiment and the semiconductor device of the comparative example.

DETAILED DESCRIPTION OF THE INVENTION

Figure 1A:
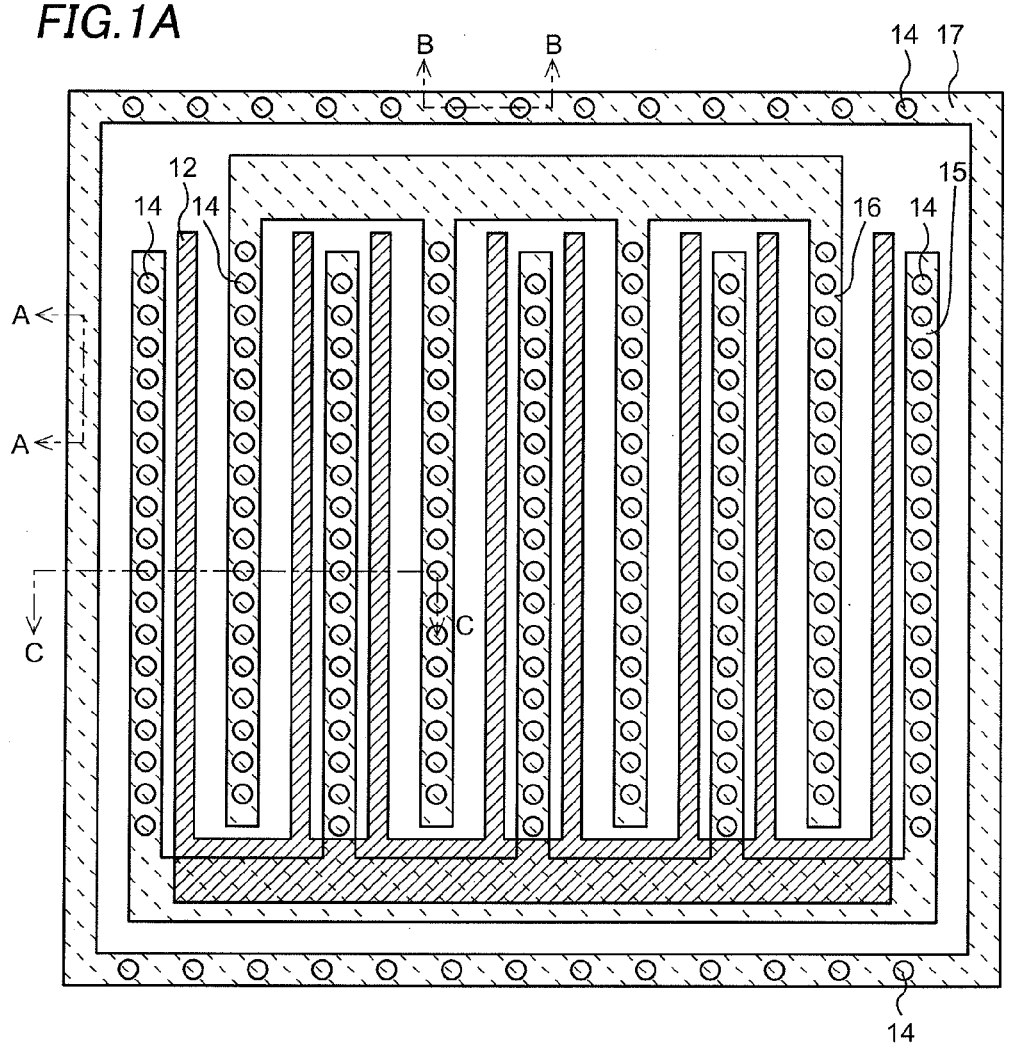
FIGS. 1A, 1B, 1C, 1D, 1E and 1F are a plan view of a semiconductor device of an embodiment and cross-sectional views of a P+ type contact layer portion of the semiconductor device.
Figure 1B:
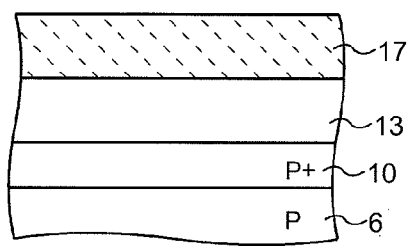
Figure 1C:
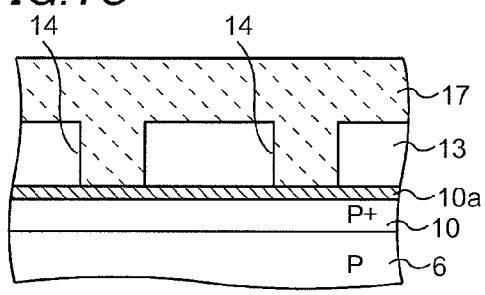

The feature of a MOS transistor as an ESD protection element of an embodiment will be described hereafter referring to FIGS. 1A to 5. FIG. 1A is a plan view of the ESD protection element of the embodiment, FIG. 1B is a cross-sectional view of FIG. 1A along line A-A, and FIG. 1C is a cross-sectional view of FIG. 1A along line B-B. FIG. 2 is a cross-sectional view of a main portion of FIG. 1A along line C-C.

Figure 3A:
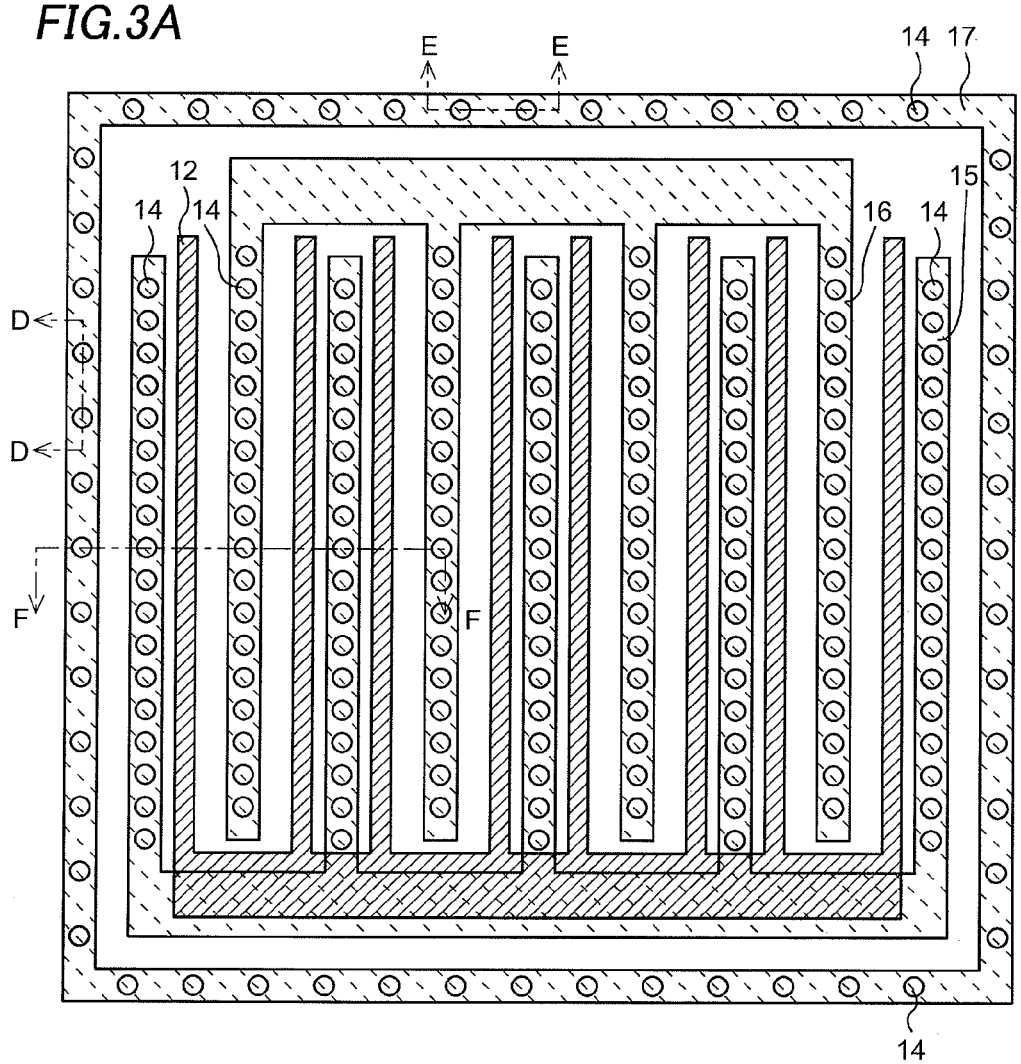
FIGS. 3A, 3B and 3C are a plan view of a semiconductor device of a comparative example and cross-sectional views of a P+ type contact layer portion of the semiconductor device.
Figure 3B:
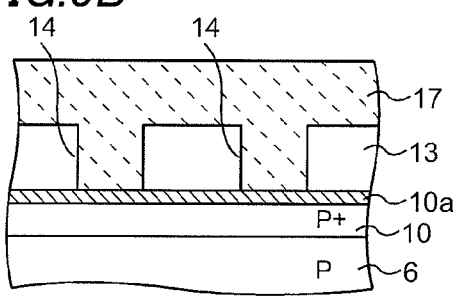
Figure 3C:
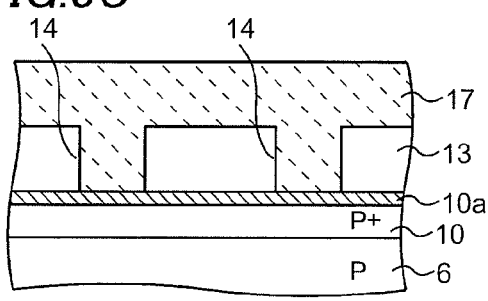
Figure 4:
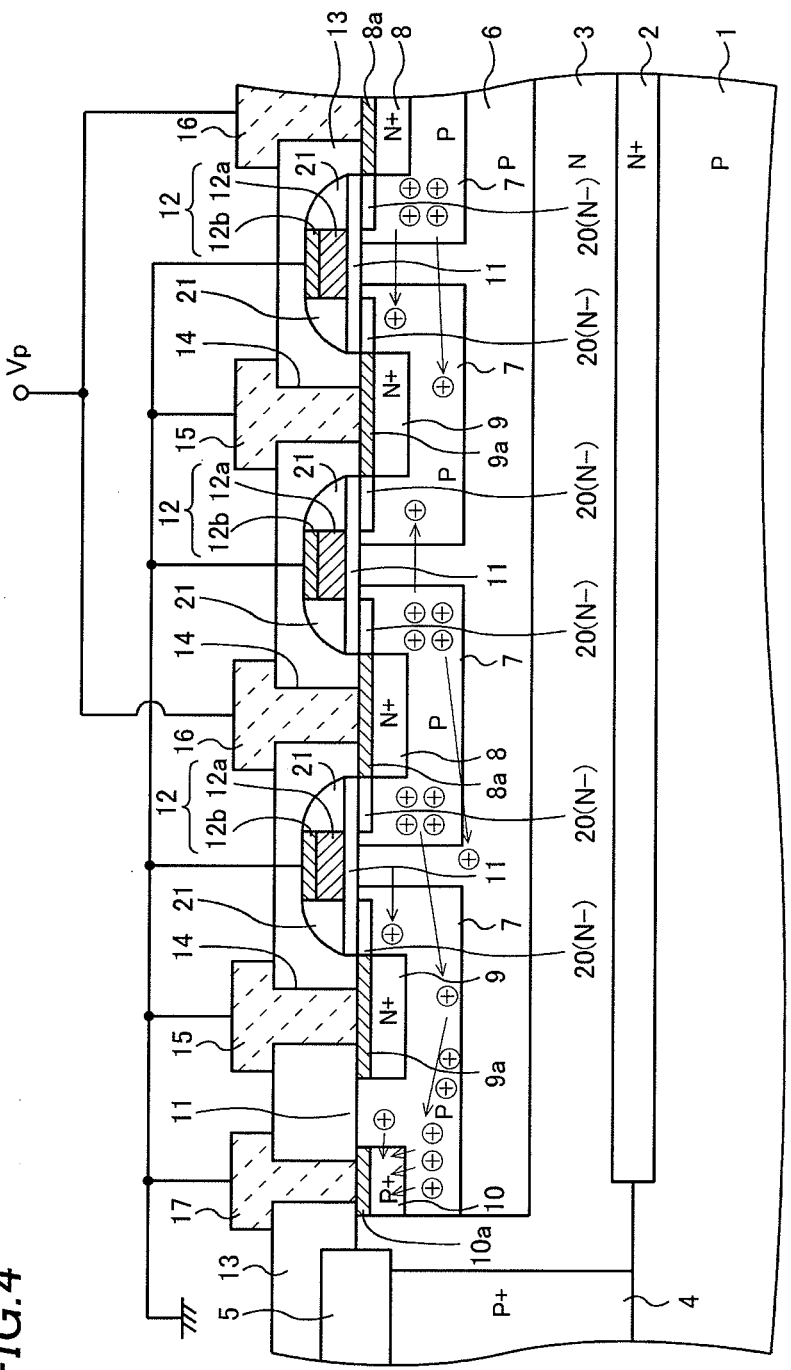
FIG. 4 is a cross-sectional view of a main portion of the semiconductor device of the comparative example, showing the operation of a parasitic bipolar transistor.

Furthermore, FIG. 3A is a plan view of an ESD protection element of a comparative example, FIG. 3B is a cross-sectional view of FIG. 3A along line D-D, and FIG. 3C is a cross-sectional view of FIG. 3A along line E-E. FIG. 4 is a cross-sectional view of a main portion of FIG. 3A along line F-F.

As shown in FIG. 2, in the MOS transistor as the ESD protection element of the embodiment, an N type epitaxial layer 3 is deposited on a P type semiconductor substrate 1 and an N+ type buried layer 2 is formed in a boundary region of these. The N type epitaxial layer 3 is divided in a plurality of active regions by a P+ type isolation layer 4 and an element isolation insulation film 5.

A P type well layer 6 is formed in one of the active regions, and a plurality of P type body layers 7 are formed in the P type well layer 6, being extended parallel with each other. An N+ type source layer 9 and an N+ type drain layer 8 are alternately formed in each of the P type body layers 7. Therefore, the plurality of N+ type source layers 9 and N+ type drain layers 8 are extended parallel with each other. Conductivity types such as N+, N and N− belong in one general conductivity type, and conductivity types such as P+, P and P− belong in the other general conductivity type.

Ordinarily, the P type body layer 7 is formed surrounding the N+ type source layer 9. In the embodiment, the P type body layer 7 surrounding the N+ type drain layer 8 is also formed, thereby decreasing the avalanche breakdown voltage $BV_{DS}$ between the drain and source and decreasing the snapback voltage Vt1 of the protection element. It is noted that the P type body layers 7 may not be formed and the N+ type source layers 9 and the N+ type drain layers 8 may be formed directly in the P type well layer 6.

Titanium silicide ($TiSi_2$) layers 9a and 8a are formed on the N+ type source layers 9 and the N+ type drain layers 8, respectively. An LDD (Lightly Doped Drain) layer 20 as an N− type semiconductor layer is formed in the P type body layers 7 between the N+ type drain layer 8 and a gate electrode 12 and between the N+ type source layer 9 and a gate electrode 12 by the ion implantation of impurities using the gate electrode 12 as a mask. The N+ type source layers 9 and the N+ type drain layers 8 are formed by the ion implantation of impurities using side spacers 21 as a mask which are formed on the sidewalls of the gate electrodes 12 by a predetermined method.

As shown in FIG. 1A and FIG. 2, a P+ type contact layer 10 is formed in the P type body layer 7 or the P type well layer 6 near the element isolation insulation film 5 so as to surround the plurality of N+ type source layers 9 and N+ type drain layers 8. The gate electrodes 12 which form a comb shape as a whole as shown in FIG. 1A is formed on the P type body layers 7 and the P type well layer 6 between the N+ type source layers 9 and the N+ type drain layers 8 through a gate insulation film 11.

The gate electrode 12 has a multi-layered structure, in which the lower layer is a doped polysilicon layer 12a doped with phosphorus (P) or the like and the upper layer is a titanium polycide (TiSi$_2$) layer 12b or the like, thereby decreasing the gate resistance.

Contact holes 14 are formed in an interlayer insulation film 13 deposited on the semiconductor substrate 1 including on the gate electrodes 12 etc. Source electrodes 15 connected to the titanium silicide (TiSi$_2$) layers 9a on the N+ type source layers 9 through the contact holes 14 and drain electrodes 16 connected to the titanium silicide (TiSi$_2$) layers 8a on the N+ type drain layers 8 through the contact holes 14 are made of aluminum (Al) or the like.

The source electrodes 15 and the drain electrodes 16 form finger form electrodes which are engaged, as shown in FIG. 1A. The gate electrodes 12 are drawn to under the drawn portion of the source electrodes 15 and connected to the source electrodes 15 through contact holes 14 (not shown) formed in the interlayer insulation film 13 as shown in a lower portion of FIG. 1A.

As for the P+ type contact layer 10 surrounding the plurality of N+ type source layers 9 and N+ type drain layers 8, a titanium silicide (TiSi$_2$) 10a is formed on a portion of the P+ type contact layer 10 disposed on the two sides extending in the perpendicular direction to the finger form source electrodes 15 etc as shown in FIG. 1C, and covered by the interlayer insulation film 13. A P+ type contact electrode 17 made of aluminum (Al) or the like is formed being connected to the titanium silicide (TiSi$_2$) layer 10a on the P+ type contact layer 10 through the contact holes 14 formed in the interlayer insulation film 13. The P+ type contact electrode 17 is connected to the source electrodes 15.

On the other hand, a titanium silicide (TiSi$_2$) layer is not formed on a portion of the P+ type contact layer 10 disposed on the other two sides extending in the parallel direction with the finger form source electrodes 15 etc, as shown in FIGS. 1A and 1B, and a contact hole 14 is not formed in the interlayer insulation film 13 covering the P+ type contact layer 10. A P+ type contact electrode 17 is formed on the interlayer insulation film 13. This P+ type contact electrode 17 is connected to the P+ type contact electrode 17 extending in the perpendicular direction to the finger form source electrodes 15 etc.

Figure 1D:
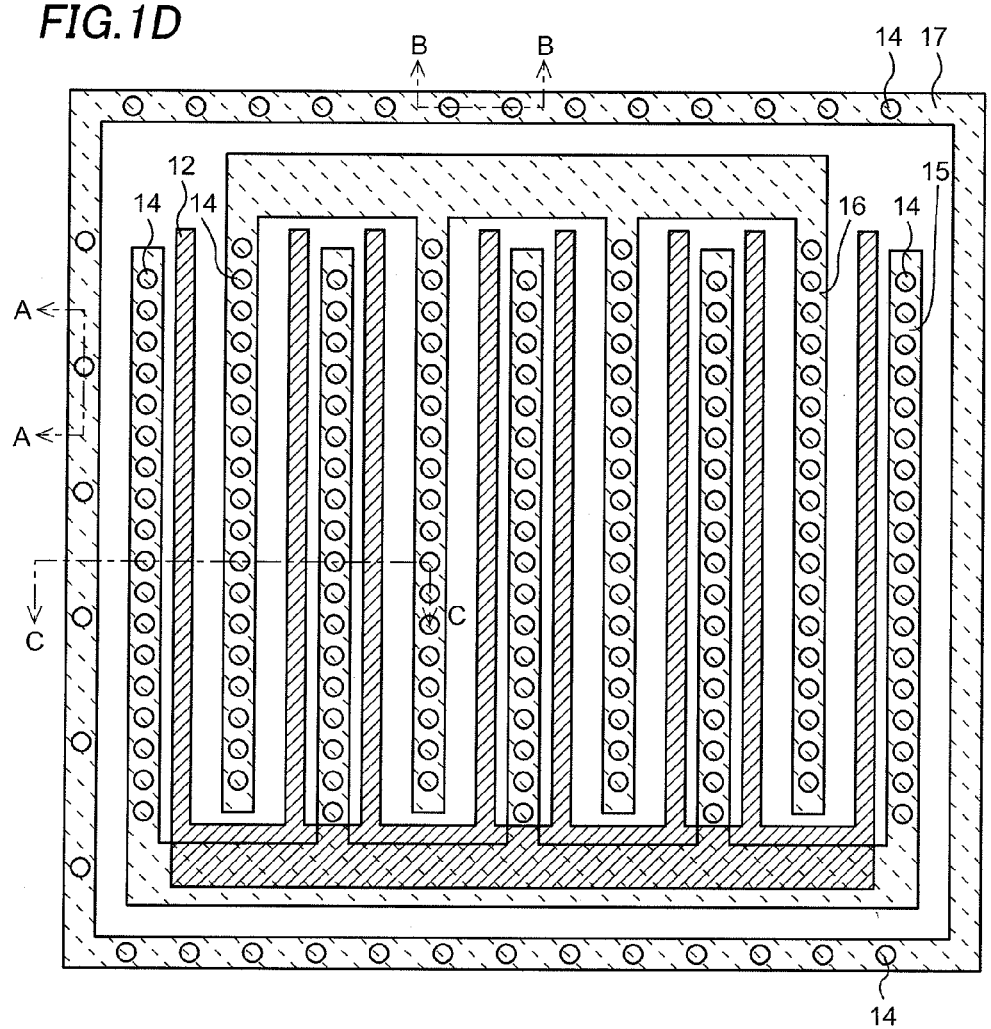
Figure 1E:
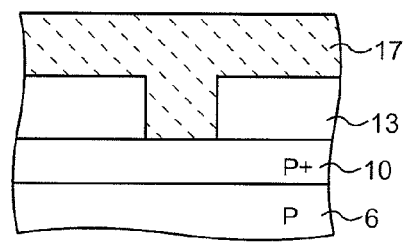
Figure 1F:
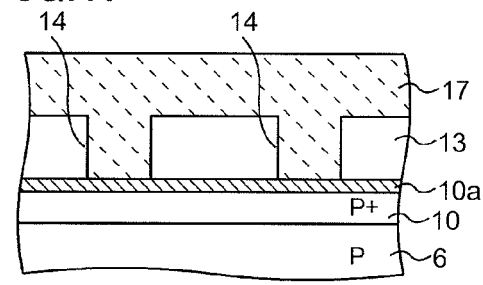
Figure 2:
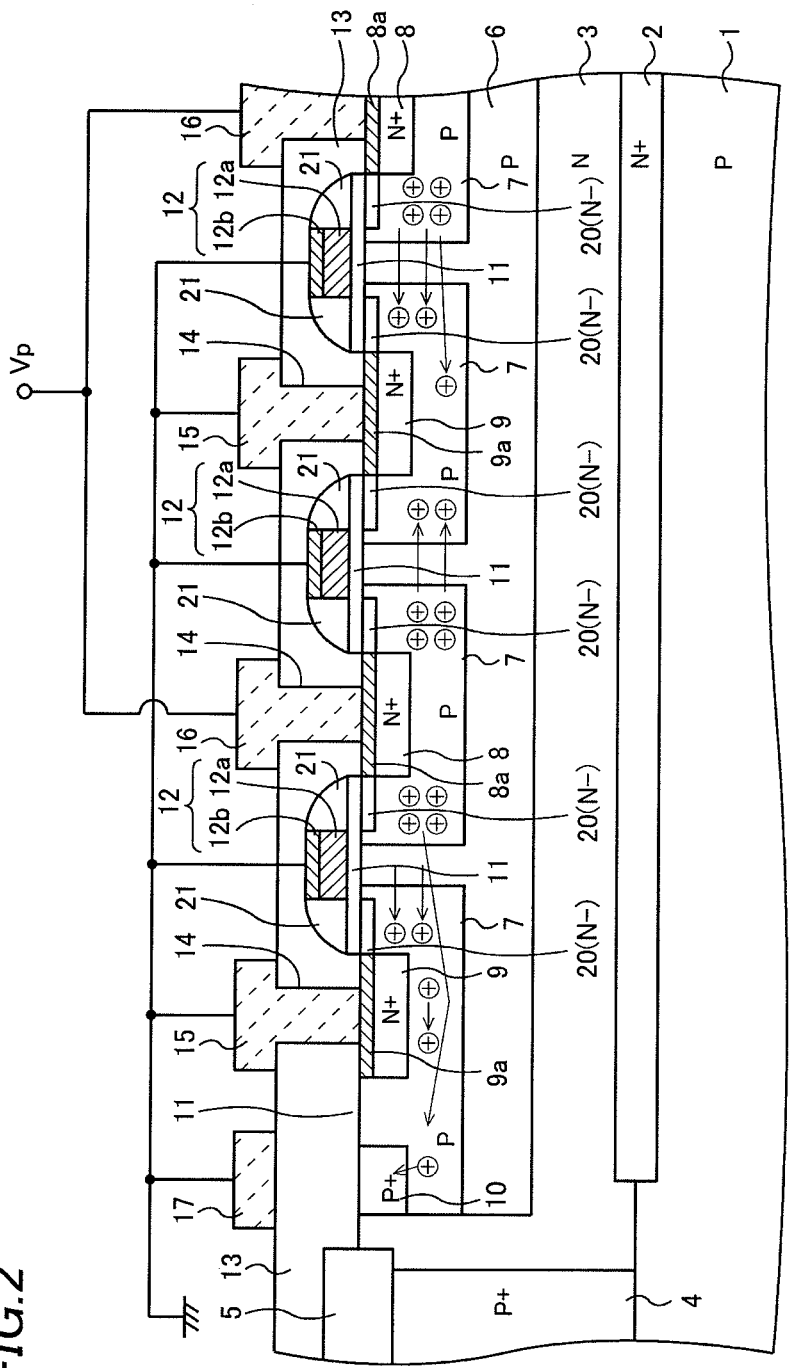
FIG. 2 is a cross-sectional view of a main portion of the semiconductor device of the embodiment, showing the operation of a parasitic bipolar transistor.

Alternatively, the P+ type contact electrode 17 extending in the parallel direction with the finger form source electrodes 15 etc is connected to the P+ type contact layer 10 through contact holes 14 formed in the interlayer insulation film 13 on the P+ type contact layer 10 as shown in FIGS. 1D and 1E. In this case, the number of the contact holes 14 is smaller than the number of the contact holes 14 formed in the interlayer insulation film 13 on the portion of the P+ type contact layer 10 extending in the perpendicular direction to the finger form source electrodes 15 etc. The number of the contact holes 14 need be adjusted to a proper number as described below.

As described above, a titanium silicide (TiSi$_2$) layer is not formed on the portion of the P+ type contact layer 10 disposed on two of the four sides, which extend in the parallel direction with the finger form source electrodes 15 etc, and a contact hole 14 is not formed in the interlayer insulation film 13 covering the P+ type contact layer 10 or the smaller number of contact holes 14 are formed therein than the number of the contact holes 14 on the portion of the P+ type contact layer 10 extending in the perpendicular direction to the finger form source electrodes 15 etc. This is the feature of the embodiment.

The feature of the ESD protection element of the embodiment will be described compared with a comparative example shown in FIGS. 3A to 4. In the comparative example, a titanium silicide (TiSi$_2$) layer 10a is formed on the portion of the P+ type contact layer 10 disposed on the two sides parallel with the finger form source electrodes 15 etc as well as on the other two sides perpendicular thereto, and a P+ type contact electrode 17 is formed being connected to the titanium silicide (TiSi$_2$) layer 10a through a multiple number of contact holes 14 formed in the interlayer insulation film 13 covering the titanium silicide (TiSi$_2$) layer 10a.

The comparative example shown in the plan view in FIG. 3A is the same as the embodiment shown in the plan view in FIG. 1A except that the structure on the portion of the P+ type contact layer 10 disposed on the two sides parallel with the finger form source electrodes 15 etc employs the same structure as on the portion of the P+ type contact layer 10 disposed on the two sides perpendicular to the source electrodes 15 etc. Therefore, FIG. 3B which is a cross-sectional view of FIG. 3A along line D-D and FIG. 3C which is a cross-sectional view of FIG. 3A along line E-E in the comparative example have the same structure as shown in FIG. 1C, respectively.

FIGS. 2 and 4 simply and schematically show the operation state of the MOS transistor as the ESD protection element when a surge voltage $V_P$ by positive static electricity is applied to the drain electrode 16 as the output terminal. The source electrodes 15, the gate electrodes 12 and the P+ type contact electrode 17 are combined and connected to the ground line. In FIGS. 2 and 4, only two of the source electrodes 15 and two of the drain electrodes 16 are shown so as to understand the invention.

When a surge voltage $V_P$ by positive static electricity larger than the drain-source breakdown voltage $BV_{Ds}$ is applied to the drain electrode 16, a depletion layer extending from the junction surface between the N+ type drain layer 8 and the P type body layer 7 into these layers causes an avalanche breakdown, and a reverse current flows between the N+ type source layer 9 and the N+ type drain layer 8. Electrons flow from the N+ type source layer 9 into the depletion layer, and are accelerated by a high electric field in the depletion layer to become hot electrons.

The hot electrons influence the lattice of the semiconductor substrate in the depletion layer near the N+ type drain layer 8 to generate multiple pairs of holes and electrons. The multiple electrons thus generated flow into the N+ type drain layer 8 of high potential, while the multiple holes flow toward the N+ type source layer 9 of low potential. The holes are schematically shown by + circled by ○.

As shown in FIGS. 2 and 4, for example, the holes formed in the depletion layer near the N+ type drain layer 8 on the left side flow toward the N+ type source layers 9 of low potential on either side of this N+ type drain layer 8, and the holes generated near the N+ type drain layer 8 partially shown in the right end flow toward the N+ type source layer 9 disposed on the left side of this the N+ type drain layer 8. As a result, the multiple holes are accumulated around these N+ type source layers 9 to increase the potential of the P type body layer 7 in these portions.

Some of the holes which flow from the N+ type drain layer 8 toward the N+ type source layer 9 next to the P+ type contact layer 10 and are accumulated around the N+ type source layer 9 in this portion flow toward the P+ type contact layer 10 having a low bather for the holes. Therefore, the potential of the P type body layer 7 near the N+ type source layer 9 in this portion decreases.

However, in the ESD protection element of the embodiment shown in FIG. 2, there does not exist a titanium silicide (TiSi$_2$) layer 10a on the P+ type contact layer 10, and a contact hole 14 is not formed in the interlayer insulation film 13 covering the P+ type contact layer 10.

Therefore, the holes flowing into the P+ type contact layer 10 flow through this P+ type contact layer 10 having a higher resistance than that of the titanium silicide (TiSi$_2$) layer 10a to reach the portion of the P+ type contact layer 10 disposed on the two sides perpendicular to the finger foam source electrodes 15 etc, pass through the titanium silicide (TiSi$_2$) layer 10a, flow through the contact holes 14 formed in the interlayer insulation film 13 into the P+ type contact electrode 17 having a low resistance, and then flow out into the ground line.

In detail, the holes flowing into the P+ type contact layer 10 can not flow into the ground line without passing through the portion of the long P+ type contact layer 10 having a relatively high resistance which is parallel with the finger form source electrodes 15 etc. Therefore, the holes are prevented from flowing into the P+ type contact layer even from the P type body layer around the N+ type source layer 9 next to the P+ type contact layer 10. Almost all the holes accumulated around the N+ type source layer 9 disposed away from the P+ type contact layer 10 do not flow into the P+ type contact layer 10.

Therefore, each of the parasitic bipolar transistors which uses the N+ type source layer 9 as the emitter, the P type body layer 7 as the base and the N+ type drain layer 8 as the collector in the finger portion turns on equally, thereby flowing a large snapback current. This results in discharging a surge voltage by positive static electricity to the ground line immediately.

On the other hand, as shown in FIG. 4, in the case of the comparative example, the titanium silicide (TiSi$_2$) layer 10a having a low resistance is formed on the surface of the P type contact layer 10 next to the N+ type source layer 9 in the same manner as on the portion of the P+ type contact layer 10 disposed perpendicular to the finger form source electrodes 15 etc. Furthermore, the multiple contact holes 14 are formed in the interlayer insulation film 13 covering the titanium silicide (TiSi$_2$) layer 10a, and the P+ type contact electrode 17 having a low resistance is formed being connected to the titanium silicide (TiSi$_2$) layer 10a through these contact holes.

Therefore, the holes flowing from the depletion layer near the N+ type drain layer 8 toward the N+ type source layer 9 of low potential are not accumulated in the P type body layer near this N+ type source layer 9 and flow into the P+ type contact layer 10 having a low barrier for the holes. The holes pass through the titanium silicide (TiSi$_2$) layer 10a having a low resistance, flow into the P+ type contact electrode 17 having a lower resistance through the contact holes 14, and are discharged to the ground line.

In detail, in the case of the comparative example, since the electric resistance against the flow of holes to the ground line is low, almost all the holes flowing into the region around the N+ type source layer 9 next to the P+ type contact layer 10 flow into the P+ type contact layer 10 and thus the parasitic bipolar transistor in this portion does not turn on. Some of the holes flowing into the region around the N+ type source layer 9 disposed away from the P+ type contact layer 10 shown on the right side in FIG. 4 also flow into the P+ type contact layer 10, and the parasitic bipolar transistor in this portion does not also turn on or delays turning on.

As a result, the discharge of the positive static electricity to the ground line is delayed, thereby causing a problem that the power LDMOS transistor as the protected element is not protected enough from the static electricity.

FIG. 5 shows a comparison of the ESD protection characteristics of the ESD protection element of the embodiment and the ESD protection element of the comparative example by showing the TLP voltage on the x axis and the TLP current on the y axis. The TLP is an abbreviation of a Transmission Line Pulse, which is a pulse having a small width obtained by discharging an electric charge accumulated in a coaxial cable.

In FIG. 5, the ESD protection characteristics are compared by using a TLP voltage which is generatable artificially instead of a surge voltage by positive static electricity which is irregularly applied. By a TLP evaluation method using the pulse, the characteristic of the TLP current relative to the TLP voltage is evaluable without breaking the ESD protection circuit with a large current to about 10 A.

When a TLP voltage larger than the drain-source breakdown voltage $BV_{DS}$ is applied to the drain electrode 16 of the LDMOS transistor as the protection element, an avalanche current flows between the drain electrode 16 and the source electrode 15 as a TLP current. When the drain-source voltage $V_{DS}$ reaches a predetermined voltage Vt by the increase of the TLP current, the parasitic bipolar transistor described above turns on to cause a snapback phenomenon and the drain-source voltage $V_{DS}$ decreases to a predetermined voltage $V_H$.

The voltage Vt to turn on the parasitic bipolar transistor is called a snapback voltage, and the voltage $V_H$ is called a hold voltage. The hold voltage $V_H$ almost corresponds to the emitter-collector breakdown voltage $V_{CER}$ of the parasitic bipolar transistor described above. After then, the TLP current increases again. In the case of the comparative example, the parasitic bipolar transistor described above does not turn on in the N+ type source layer 9 portion next to the P+ type contact layer 10 disposed in the periphery region. In the N+ type source layer 9 portion in the more inner region, too, the parasitic bipolar transistor does not turn on or delays turning on compared with in the N+ type source layer 9 portion in the center portion. Therefore, the TLP current as the snapback current increases, forming a only gentle gradient as shown by b in FIG. 5, and the ESD protection element is broken by heat at the TLP current of It1 or more.

On the other hand, in the ESD protection element of the embodiment, as shown in FIG. 1B, the titanium silicide (TiSi$_2$) layer 10a having a low resistance is not formed on the P+ type contact layer 10 in the periphery region, and the contact hole 14 which is formed in the interlayer insulation film 13 covering the titanium silicide (TiSi$_2$) layer 10a and connected to the P+ type contact electrode 17 in the comparative example is not formed, too.

Therefore, even in the N+ type source layer 9 portion next to the P+ type contact layer 10, holes are accumulated near the N+ type source layer 9 to increase the potential of the P type body layer in this portion and turn on the parasitic bipolar transistor. The TLP current as the snapback current increases, forming a steeper gradient than in the comparative example as shown by a in FIG. 5.

In detail, the thermal breakdown current It2 of the ESD protection element of the embodiment is larger than that of the ESD protection element of the comparative example, achieving a larger TLP current flow. When a surge voltage by large positive static electricity is applied to the drain electrode 16 actually, the ESD protection element of the embodiment discharges the static electricity to the ground line etc more immediately than the ESD protection element of the comparative example.

Therefore, the power LDMOS transistor as the ESD protected element is protected from static electricity more immediately than in the comparative example.

When a surge voltage by large negative static electricity is applied to the drain electrode 16, the static electricity is discharged to the ground line through the forward biased P+ type contact layer 10. In this case, when a titanium silicide (TiSi$_2$) layer 10a does not exist on the P+ type contact layer 10 and a contact hole 14 is not formed in the interlayer insulation film 13 covering the P+ type contact layer 10 as shown in FIG. 1B, the negative static electricity flowing into the P+ type contact layer 10 is discharged to the ground line through the relatively large resistance.

Thus, there may occur a problem that large negative static electricity is not discharged to the ground line immediately. For addressing this problem, contact holes 14 are formed in the interlayer insulation film 13 on the portion of the P+ type contact layer 10 on the two sides parallel with the finger form source electrodes 15 etc as shown in FIG. 1D, FIG. 1E, too, and the P+ type contact layer 10 and the P+ type contact electrode 17 are connected through these contact holes 14. By this, negative static electricity is discharged to the ground line through the P+ type contact electrode 17 made of aluminum (Al) or the like having a low resistance as a discharge path.

In this case, since the resistance of the flow path of holes to the ground line described above is also decreased, holes accumulated around the N+ type source layer 9 in the region next to the P+ type contact layer 10 become easy to flow into the P+ type contact layer 10. This need be taken into account. In order to prevent holes from flowing into the P+ type contact layer 10, the number of the contact holes 14 formed on the P+ type contact layer 10 in this portion need be smaller than the number of the contact holes on the portion of the P+ type contact layer 10 perpendicular to the finger form source electrodes 15. In detail, for addressing surge voltages by positive and negative static electricities with good balance, the number of the contact holes 14 need be adjusted to a proper number so as to make the resistance high in the flow path of holes to the P+ type contact electrode 17 having a low resistance.

Figure 6A:
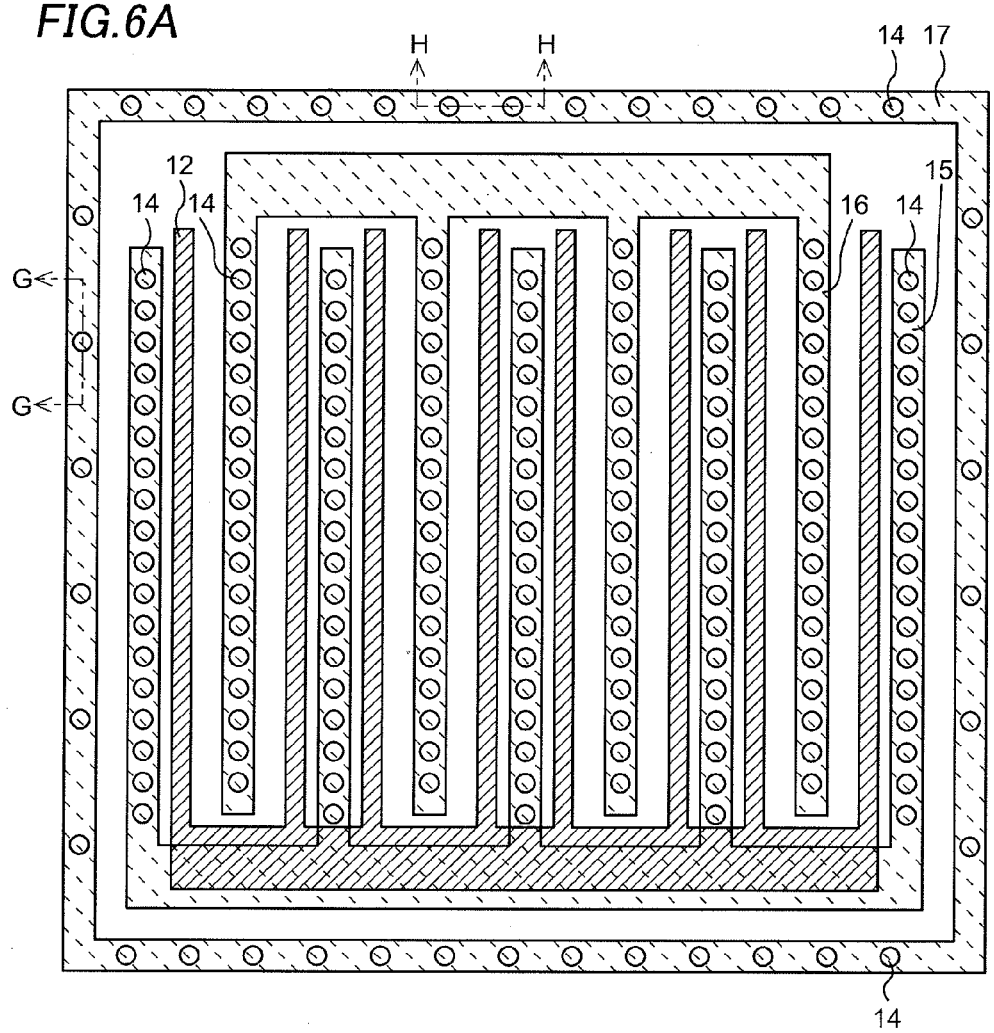
FIGS. 6A, 6B, 6C, 6D, 6E and 6F are a plan view of a semiconductor device of other embodiment and cross-sectional views of a P+ type contact layer portion of the semiconductor device.
Figure 6B:
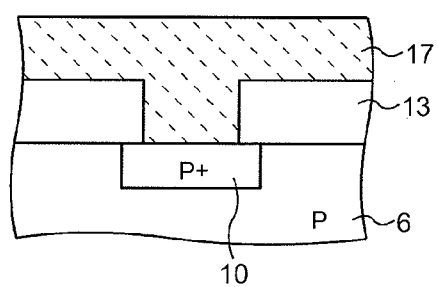
Figure 6C:
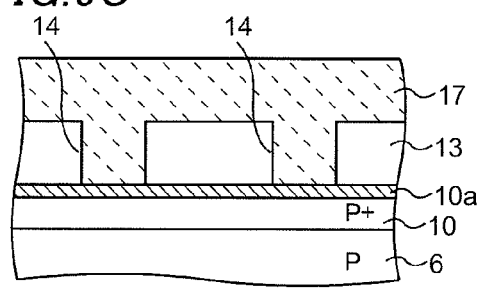

In this case, the portion of the P+ type contact layer 10 extending parallel with the finger form source electrodes 15 etc is not formed continuously, and is uncontinuously formed on the surface of the P type well layer 6 only in the positions of the contact holes 14 and near the contact holes 14 as shown in FIGS. 6A and 6B. By this, holes flowing into the P type well layer 6 etc between the uncontinuously formed P+ type contact layers 10 flow through the P type well layer 6 etc having a larger resistance than the P+ type contact layer 10, thereby minimizing the amount of holes flowing into the P+ type contact layer 10.

Furthermore, when the P+ type contact layer 10 is formed on the P type well layer 6 etc only in the positions of the contact holes 14, an N+ type discharge layer 18 may be formed on the surface of the P type well layer 6 etc where the P+ type contact layers 10 are not formed, being connected to the P+ type contact layers 10 and extending parallel with the finger form source electrodes 15 etc. The N+ type discharge layer 18 is connected to the P+ type contact electrode 17 through the contact holes 14 formed in the interlayer insulation film 13.

Figure 6D:
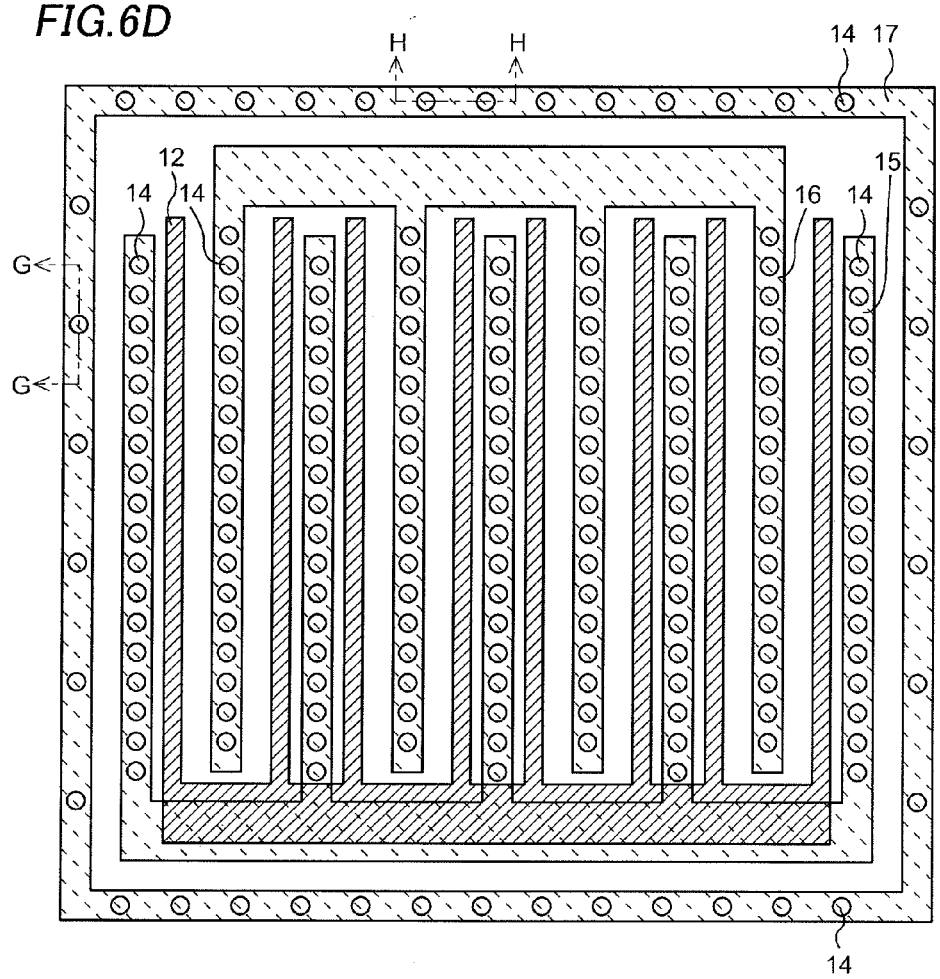
Figure 6E:
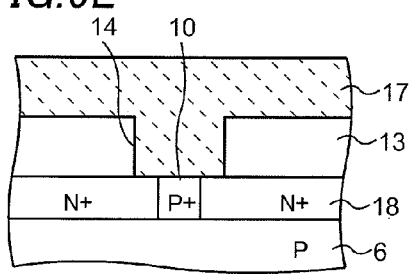
Figure 6F:
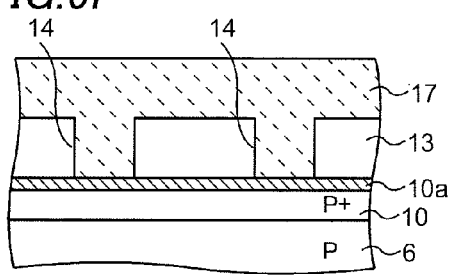
Figure 7:
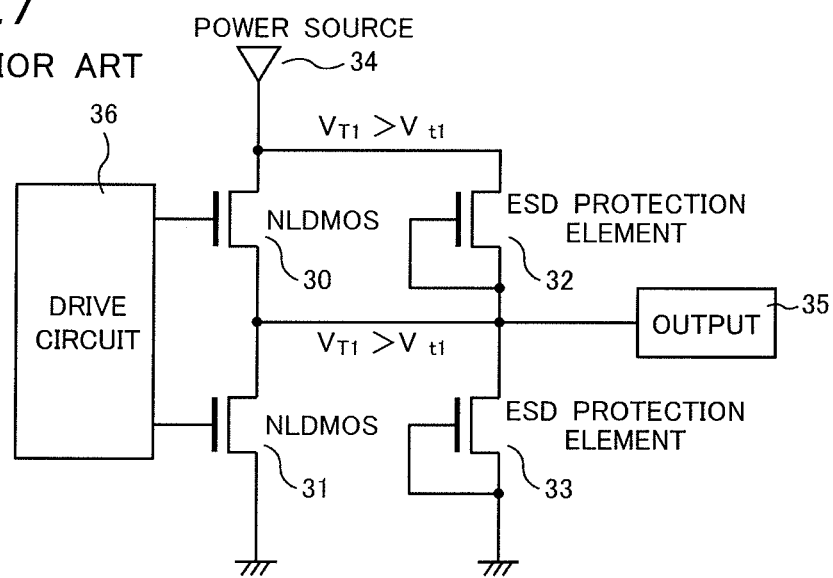
FIG. 7 is a circuit diagram of an ESD protection circuit showing a configuration of power LDMOS transistors as protected elements and MOS transistors as protection elements.
Figure 8:
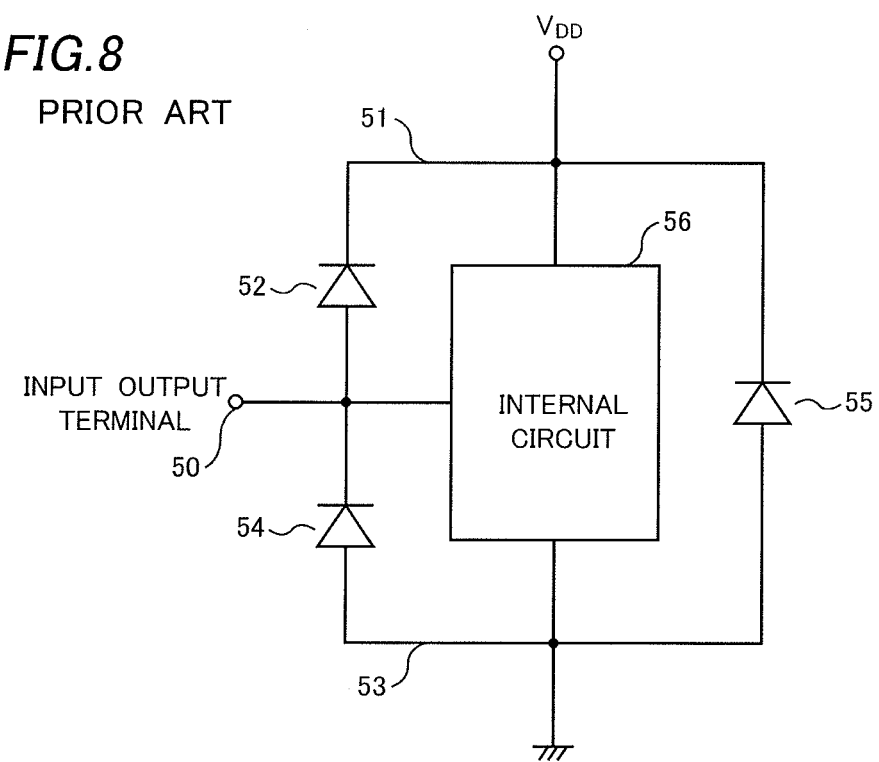
FIG. 8 is a circuit diagram of a conventional ESD protection circuit using ordinary PN junction diodes.

The plan view of this protection element is shown in FIG. 6D, the cross-sectional view of FIG. 6D along line G-G is shown in FIG. 6E, and the cross-sectional view of FIG. 6D along line H-H is shown in FIG. 6F. FIG. 6D has the same structure as the structure shown in FIG. 1 except the structure of the portion of the P+ type contact layer 10 parallel with the finger form source electrodes 15 etc.

Since the number of the portions where the P+ type contact layers 10 are formed is small, holes flowing toward the P+ type contact layer 10 flow into the region around the N+ type discharge layer 18 of which the potential is low like the P+ type contact layer 10. At this time, the potential of the P type well layer 6 etc near the N+ type discharge layer 18 becomes high to turn on a parasitic bipolar transistor which uses the N+ type discharge layer 18 as the emitter, the P type well layer 6 etc as the base and the N+ type drain layer 8 as the collector, thereby increasing a discharge path for flowing positive static electricity to the ground line.

Although the embodiment is described in a case of an N type MOS transistor as an ESD protection element, the invention is also similarly applicable to a P type MOS transistor within the scope of the invention.

The invention enhances the ESD protection characteristic of a semiconductor device by uniformly turning on the parasitic bipolar transistors each including the N+ type source layer connected to a finger portion of the finger form source electrode, the N+ type drain layer connected to a finger portion of the finger form drain electrode, and the P type body layer.

What is claimed is:

1. A semiconductor device comprising:
   a semiconductor layer of a first general conductivity type;
   an element isolation insulation film isolating the semiconductor layer;
   a well layer of a second general conductivity type formed in a surface portion of the semiconductor layer;
   a plurality of body layers of the second general conductivity type formed in a surface portion of the well layer so as to extend parallel with each other in a first direction;
   a plurality of source layers of the first general conductivity type and a plurality of drain layers of the first general conductivity type which are formed in surface portions of corresponding body layers so that the source layers and the drain layers extend in the first direction and alternate in a second direction perpendicular to the first direction;
   a contact layer of the second general conductivity type formed in a surface portion of the well layer and a surface portion of the body layer adjacent the element isolation insulation film, the contact layer surrounding the source layers and the drain layers;
   a gate electrode formed on the body layer and the well layer and extending in the first direction between the source layers and the drain layers;
   metal silicide layers formed in surface portions of the source layers, in surface portions of the drain layers, and in surface portions of a portion of the contact layer that extends in the second direction, no metal silicide layer being formed in a surface portion of a portion of the contact layer that extends in the first direction; and
   a finger form source electrode, a finger form drain electrode, and a contact electrode surrounding the source and drain electrodes, each of the source, drain and contact electrodes being connected to the metal silicide layers through contact holes formed in an interlayer insulation film deposited on the metal silicide layers.

2. The semiconductor device of claim 1, wherein contact holes are formed in the interlayer insulation film in the portion of the contact layer extending in the first direction, and the contact layer is connected to the contact electrode through the contact holes.

3. The semiconductor device of claim 2, wherein the portion of the contact layer extending in the first direction is formed in a surface portion of the body layer or the well layer only in a region exposed through the contact holes formed in the interlayer insulation film and adjacent the contact hole.

4. The semiconductor device of claim 3, further comprising a discharge layer of the first general conductivity type formed in the body layer or the well layer in regions of the contact holes and adjacent the contact holes so as to extend in the first direction, the discharge layer being connected to the contact layer and the contact electrode.

5. The semiconductor device of claim 1, wherein a source layer is formed adjacent the portion of the contact layer extending in the first direction.

6. The semiconductor device of claim 1, wherein the semiconductor layer is an epitaxial layer of the first general conductivity type formed on a semiconductor substrate of the second general conductivity type, the epitaxial layer is divided into a plurality of regions by an isolation layer of the second general conductivity type under the element isolation insulation film.

* * * * *